United States Patent
Lee et al.

(10) Patent No.: US 6,867,087 B2
(45) Date of Patent: Mar. 15, 2005

(54) FORMATION OF DUAL WORK FUNCTION GATE ELECTRODE

(75) Inventors: Kilho Lee, Wappingers Falls, NY (US); Woo-Tang Kang, Wappingers Falls, NY (US); Rajesh Rengarajan, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 368 days.

(21) Appl. No.: 09/988,183

(22) Filed: Nov. 19, 2001

(65) Prior Publication Data

US 2003/0096471 A1 May 22, 2003

(51) Int. Cl.$^7$ .......................................... H01L 21/8238
(52) U.S. Cl. .................... 438/232; 438/119; 438/120; 438/231
(58) Field of Search ................. 438/232, 119, 438/120, 231

(56) References Cited

U.S. PATENT DOCUMENTS

| | | | | |
|---|---|---|---|---|
| 5,278,096 A | | 1/1994 | Lee et al. .................... | 437/162 |
| 5,464,789 A | | 11/1995 | Saito .......................... | 438/592 |
| 5,563,093 A | * | 10/1996 | Koda et al. .................. | 438/231 |
| 6,159,810 A | | 12/2000 | Yang .......................... | 438/301 |
| 6,221,744 B1 | | 4/2001 | Shih et al. .................. | 438/585 |
| 6,291,278 B1 | * | 9/2001 | Xiang et al. ................ | 438/197 |
| 6,410,376 B1 | * | 6/2002 | Ng et al. .................... | 438/199 |

* cited by examiner

*Primary Examiner*—Long Pham
*Assistant Examiner*—Nathan W. Ha
(74) *Attorney, Agent, or Firm*—Slater & Matsil, L.L.P.

(57) ABSTRACT

In a method of making a dual work function gate electrode of a CMOS semiconductor structure, the improvement comprising formation of the dual work function gate electrode so that there is no boron penetration in the channel region and no boron depletion near the gate oxide, comprising:

a) forming a gate oxide layer over a channel of a nMOS site and over a channel of a pMOS site;

b) forming an undoped polysilicon layer over the gate oxide layer;

c) masking the pMOS site, forming an a-Si layer over the nMOS site using a first heavy ion implantation, and implanting arsenic solely into the a-Si layer;

d) masking the nMOS site formed by step c), forming an a-Si layer over the pMOS site using a second heavy ion implantation, and implanting boron solely into the a-Si regions;

e) laser annealing the nMOS and pMOS sites for a short time and at an energy level sufficient to melt at least a portion of the a-Si but insufficient to melt the polysilicon; and f) affecting cooling after laser annealing to convert a-Si into polysilicon without gate oxide damage.

12 Claims, 5 Drawing Sheets

(nMOS)

(pMOS)

FORMATION OF DUAL WORK FUNCTION GATE ELECTRODE

BACKGROUND OF THE INVENTION

1. Field of the Invention

The invention relates to a method for forming p-type doped gate electrodes during manufacture of CMOS semiconductor structures without boron penetration into the channel region and without boron depletion near the gate oxide.

2. Description of The Related Art

It is known that, in forming a gate on a substrate during manufacturing of a semiconductor device, large grain polysilicon is used as the gate material. However, due to the fact that the surface of the layer formed by the large grain poly-silicon is rough because of the size of the grain, UV exposure light is scattered upon patterning the poly-silicon layer to form gates. Unfortunately, when this happens, the critical dimension of the gate is extremely difficult to control and uniformity of the gate cannot be obtained.

To resolve this problem in the conventional method of manufacturing semiconductor devices, amorphous silicon (a-Si) is employed as the gate material on a substrate. Because the surface of the layer formed by an a-Si is far smoother than that of large-grain poly-silicon, satisfactory critical dimension and uniformity of the gate maybe obtained. Nevertheless, in later thermal processes, the a-Si re-crystallizes at elevated temperatures to form large-grain poly-silicon. The formation of large-grain poly-silicon produces a channeling effect at the interface between the poly-silicon gate and the gate oxide layer. This channeling effect causes penetration of conductive ions i.e. p-type ion dopants, such as the boron ion, through the large-grain poly-silicon into the gate oxide.

U.S. Pat. No. 6,221,744 B1 disclose a method for forming a gate on a substrate during manufacturing of a semiconductor device. The process comprises:

forming a gate oxide layer on the substrate;

forming a polysilicon layer on the gate oxide layer;

forming an amorphous silicon layer on the polysilicon layer, wherein the amorphous silicon layer includes grains defining a plurality of first sizes;

defining the amorphous silicon layer and the polysilicon layer to form a gate structure; and converting a first part of the grains of the amorphous silicon layer to polysilicon grains defining a plurality of second sizes so as to form a grain boundary between the amorphous silicon layer and the polysilicon layer, wherein each second size is smaller than the first size of the amorphous silicon layer grain.

Gate and field effect transistors including amorphous impurity layers are disclosed in U.S. Pat. No. 6,159,810. These gate electrodes for integrated circuit field effect transistors are fabricated by forming a polysilicon layer on a gate insulating layer, forming an amorphous impurity layer on the polysilicon layer, and forming an amorphous silicon layer on the amorphous impurity layer.

More specifically, a polysilicon layer 15 is formed on the gate insulating layer 13. The polysilicon layer may be doped with an n-type impurity, such as arsenic or phosphorus, or a p-type impurity such as boron. In FIG. 4, an amorphous impurity layer 17 is formed on the polysilicon layer 15 . . . The amorphous impurity layer 17 may be formed using plasma processing, ion implantation and/or other techniques. Then, as shown in FIG. 5, an amorphous silicon layer 19 is formed on the amorphous impurity layer 17 . . . Then, referring back to FIG. 2, the amorphous impurity layer 17 and the amorphous silicon layer 19 are converted into a polysilicon gate electrode having a first surface 201a adjacent the gate insulating layer 113, a second surface 201b opposite the gate insulating layer and a buried doped layer within the polysilicon gate electrode that is spaced apart from the first and second surfaces thereof. During this conversion, dopants in the amorphous impurity layer 117 may diffuse upward and downward into the polysilicon gate electrode 201, to form a doping profile that peaks within the polysilicon gate electrode 201." (col. 5, line 24-col. 6, line 4).

U.S. Pat. No. 5,278,096 disclose a gate formation method with an undoped poly-silicon layer.

Formed upon polysilicon layer 15 is tungsten silicide layer 17 . . . Layer 17 is desirably formed by sputtering . . . . The sputtering process produces a comparatively amorphous layer (col. 2, lines 18–27). Layer 19 is formed upon layer 17. Layer 19 may be any dielectric formed at a sufficiently low temperature to prevent crystallization of silicide layer 17 . . . Reference numeral 23 denotes an implantation species which may be, typically, elemental boron . . . [T]he peak of the implantation dosage is near the top surface of silicide layer 17 in the as-implanted stage. Little boron penetrates into polysilicon layer 15. After the implantation is performed, an annealing step, typically 30 minutes at approximately 900° C., is performed. The annealing step drives boron dopant from silicide 17 into polysilicon layer 15." (col. 2, line 33-col. 3, line 2).

A method of manufacturing a CMOS semiconductor device is disclosed in U.S. Pat. No. 5,464,789. The method includes: forming a polysilicon film over a gate oxide film, forming a film of an amorphous material over the polysilicon film, and implanting boron atoms into the polysilicon film through the film of amorphous material.

In the aggressive scaling of CMOS devices to smaller feature sizes wherein there is the requirement of the use of surface-channel pMOSFET to minimize the short-channel effect to improve device performance, wherein a p-type doped gate electrodes must inevitably be used to realize the surface-channel pMOSFET, and wherein formation of p-type doped gate electrodes is very difficult due to severe boron penetration into the channel region during subsequent high-thermal processes, and wherein to suppress boron penetration low thermal processing is required but leads to boron depletion near the gate oxide, there is a need to devise a process wherein a p-type doped gate electrode may be formed without boron penetration into the channel region and without boron depletion near the gate oxide.

SUMMARY OF THE INVENTION

One object of the present invention is to provide a dual work function gate electrode for a CMOS semiconductor structure in which there is no boron penetration into the channel region and in which there is no boron depletion near the gate oxide.

Another object of the present invention is to provide a process for making a dual work function gate electrode CMOS semiconductor structure with p-type doped electrodes wherein, during the manufacturing process, there is substantial suppression of boron penetration onto the channel region without depletion of boron near the gate oxide.

A further object of the present invention is to provide a process for manufacturing dual work function gate electrode CMOS semiconductor structures with p-type doped electrodes without encountering severe boron penetration into the channel region during subsequent thermal processes and with elimination of the depletion of boron near the gate oxide.

In general, the invention process is accomplished by: forming an oxide layer over a channel for a nMOS transistor and over a channel for a pMOS transistor; depositing undoped polysilicon (poly-Si) over the oxide layers; forming an amorphous silicon (a-Si) layer (either by heavy ion implantation −1 to convert an upper part of the poly-Si layer to a-Si or depositing a-Si directly over the poly-Si; masking the pMOS site and implanting arsenic into the a-Si of the nMOS site; masking the nMOS site and implanting boron into the a-Si of the pMOS site after affecting heavy implantation −2; and performing laser annealing sufficient to melt at least a portion of the a-Si, but insufficient to melt the poly-Si region to convert the a-Si into poly-Si, thereby alleviating boron depletion near the gate oxide layer while avoiding boron penetration into the channel region.

BRIEF DESCRIPTION OF THE DRAWING FIGURES

DETAILED DESCRIPTION OF PREFERRED EMBODIMENT OF THE INVENTION

As mentioned, the invention process is a method of forming CMOS structures of p-type doped gate electrodes without boron penetration into the channel region and without boron depletion near the gate oxide region using laser annealing at an energy level sufficient to melt at least a portion of a-Si but insufficient to melt the poly-Si.

Figure 1:
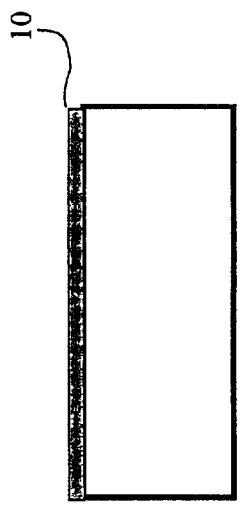
FIG. 1 is a simplified cross sectional configuration of a CMOS showing the step of gate oxidation over a channel for a nMOS transistor and over a channel of a pMOS transistor.
Figure 1:
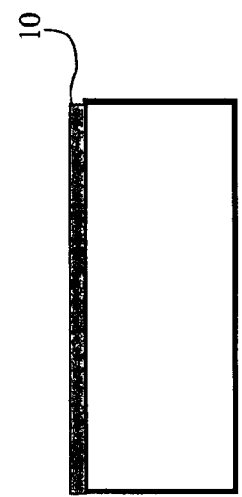
Figure 2:
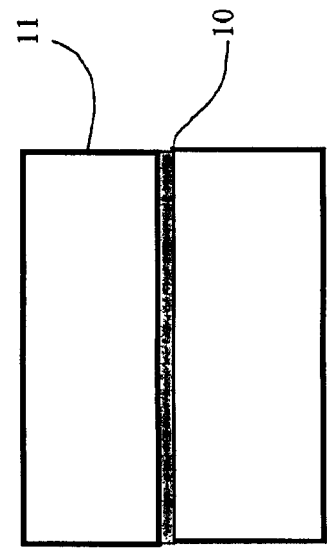
FIG. 2 depicts a simplified cross sectional CMOS configuration showing a second step in the invention process in which there is deposition of undoped polysilicon over the oxide layers of FIG. 1.
Figure 2:
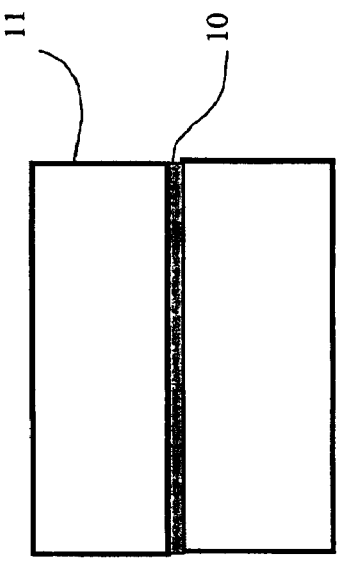

In this regard, reference is now made to FIG. 1 which depicts a simplified cross sectional configuration of a CMOS showing the step of gate oxidation over a channel for a nMOS transistor and over a channel of a pMOS transistor, in the formation of a dual work function gate electrode using bi-layer (a-Si/poly-Si), implant, and laser annealing. The gate oxidation layer of oxide 10 is deposited on each nMOS and pMOS site. Thereafter, as may be seen in FIG. 2, an undoped poly-Si layer 11 is deposited on the oxide layer 10. Preferably, the undoped poly Si deposition is between 500~3000 Å.

Figure 3:
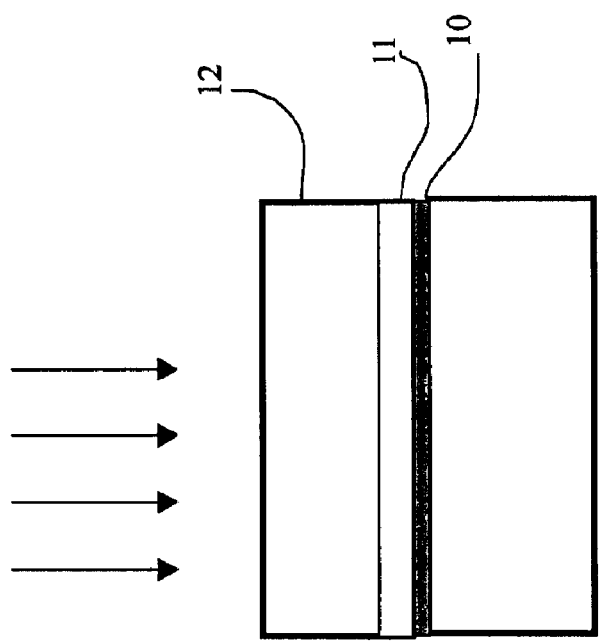
FIG. 3 depicts formation of an amorphous a-Si layer in at least two different ways: heavy ion implantation −1 to convert an upper part of the Poly-Si layer to a-Si or deposition of a-Si directly over the poly-Si; masking the p-MOS site and implantation of arsenic into the a-Si of the nMOS site.
Figure 3:
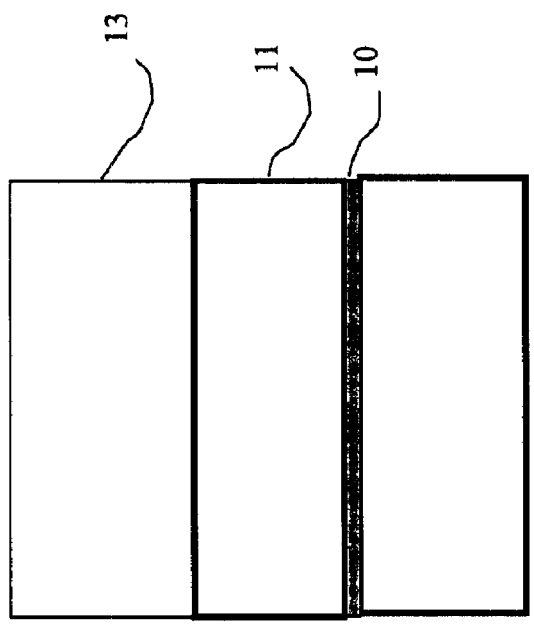

In FIG. 3 an amorphous silicon (a-Si) layer is next deposited by use of Ge, Si or any other heavy ion implantation followed by arsenic implantation into the a-Si region only.

More specifically, in FIG. 3, the a-Si layer 12 is formed by Ge implantation (maybe Si or any other heavy ion implantation −1), and followed by arsenic implantation so that, while utilizing a mask 13 to mask the pMOS site, arsenic implantation is affected into the a-Si region only. After formation of the a-Si layer, the remaining Poly-Si thickness will be between 50~200 Å. The implantation conditions for FIG. 3 are as follows:

(1) Ge implant conditions: Ge/30~300 keV/1E14~5E14

(2) Si implant conditions: Si/15 keV~150 keV/5E14~1E15

(3) Arsenic implant conditions: As/10~150 keV/1E14~3E15)

Figure 4:
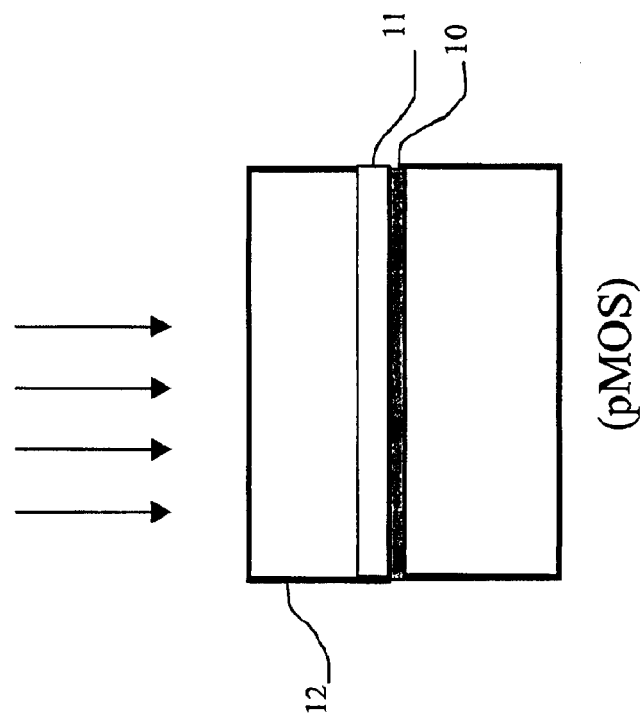
FIG. 4 depicts the steps of masking of the nMOS site, heavy implantation −2 and boron implantation into the a-Si of the pMOS site only.
Figure 4:
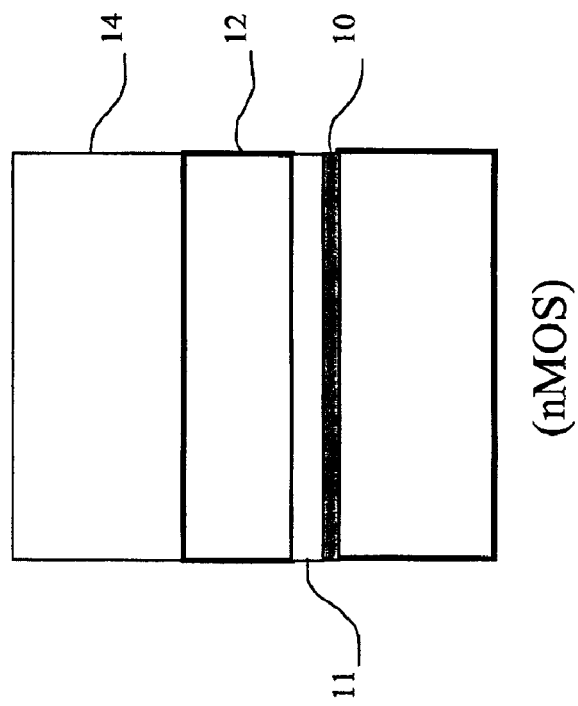

Next, as can be seen from FIG. 4, a-Si implantation is formed by use of Ge or Si or any other heavy implantation −2 by first masking the nMOS site with a mask 14 during the heavy implantation −2 and affecting boron implantation into the a-Si layer or region 12 only. In the context of the invention, the boron concentration range implanted into the a-Si region will range from about $1\times10^{19} cm^{-3}$ to about $5\times10^{20} cm^{-3}$.

Implantation conditions in FIG. 4 prior to boron implantation are as follows:

(1) Ge implant conditions: Ge/30~300 keV/1E14~5E14

(2) Si implant conditions: Si/15 kev~150 keV/5E14~1E15

Figure 5:
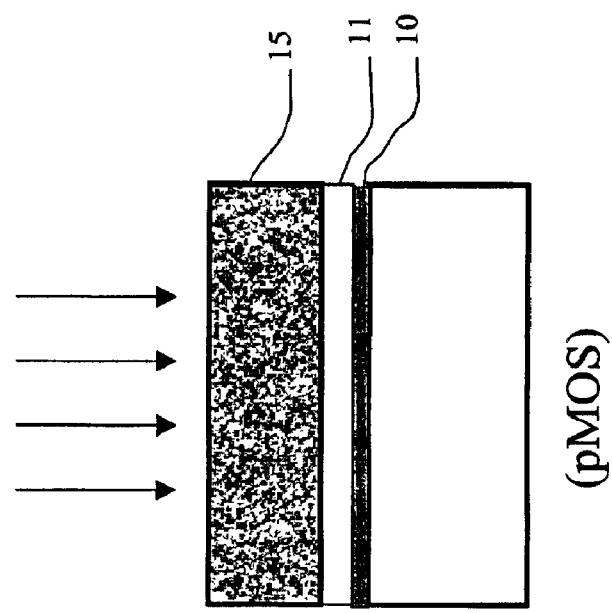
FIG. 5 depicts laser annealing at an energy level sufficient to melt at least a portion of a-Si but insufficient to melt the poly-Si, resulting in no gate oxide damage because of lack of poly-Si melting.
Figure 5:
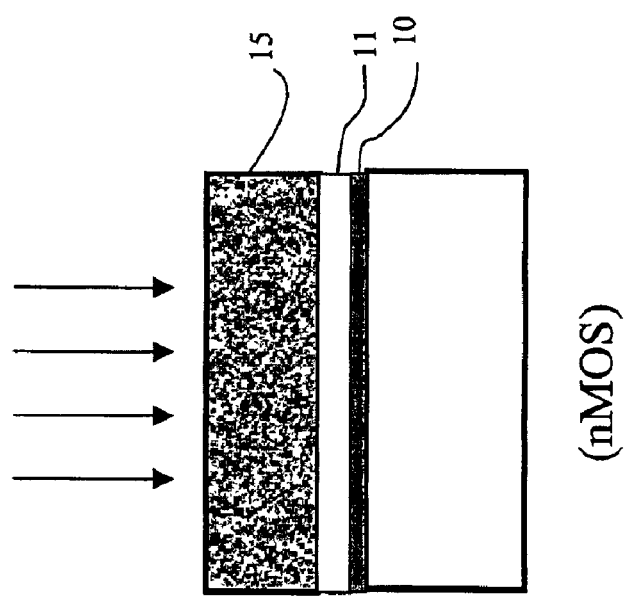

Following boron implantation, laser annealing as shown by the downward pointing arrows in FIG. 5 is utilized for a sufficient period of time and at an energy level sufficient to melt at least a portion 15 of the a-Si level but insufficient to melt the poly-Si layer 12. Accordingly, no gate oxide damage is occasioned because there is no poly-Si melted.

The laser annealing energy level sufficient to melt at least a portion of a-Si but insufficient to melt the poly-Si will range from about 0.3 $J/cm^2$ to about 0.7 $J/cm^2$. If the laser annealing energy level is beyond this range, there will either be: below the lower energy level range, no melting of any portion of the a-Si; and beyond the upper energy level range, too much melting of the a-Si to the point where the poly-Si will also be melted, thereby causing the degradation of gate oxide quality.

Continuing with FIG. 5, it should be noted that laser duration is with 40 ns (nanosecond)~80 ns pulse, and that the laser annealing step is therefore affected for an extremely short-time anneal, thereby giving rise to substantially no penetration of the dopant into the poly-Si and channel regions. Since boron depletion near the gate oxide site is a serious problem during aggressive scaling of CMOS devices to smaller feature sizes, it has been found, in the context of the invention process that depletion may also be controlled by adjusting the original thickness of the a-Si by either the Ge or Si implantation step. To suppress depletion phenomenon, the original a-Si as thick as possible and the remaining poly-Si is made as thin as possible), so that dopants in gate electrode are very close to gate oxide interface.

Figure 6:
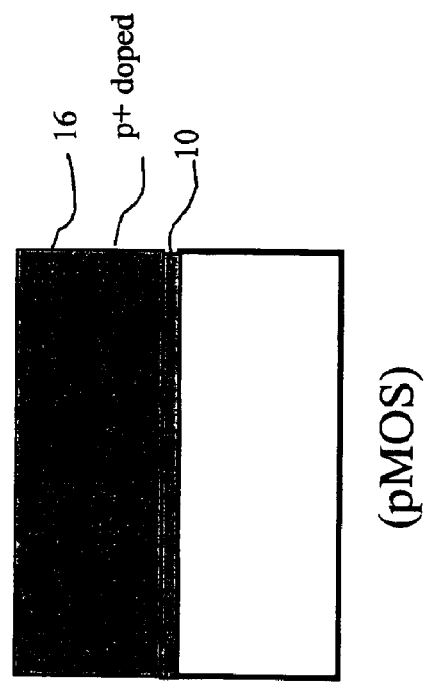
FIG. 6 depicts the nMOS and pMOS sites of the CMOS structure after laser annealing.
Figure 6:
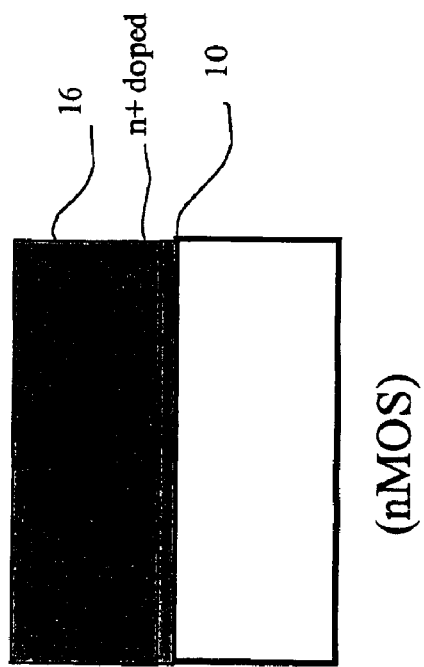

As may be seen from FIG. 6 following laser annealing total melting of the a-Si to obtain polysilicon 96 in FIG. 5, since most of dopants are activated, dopant diffusion by subsequent thermal cycles is minimized (no penetration of dopants into the channel region), however the minimized dopant diffusion is enough to dope the remaining poly-Si because the poly-Si is thin.

We claim:

1. In a method of making a dual work function gate electrode of a CMOS semiconductor structure, the improvement comprising formation of the dual work function gate electrode so that there is no boron penetration in the channel region and no boron depiction near the gate oxide, comprising:
   a) forming a gate oxide layer over a channel of a nMOS site and over a channel of a pMOS site;
   b) forming an undoped polysilicon layer over said gate oxide layer;
   c) masking said pMOS site, forming an a-Si layer over said nMOS site by implanting a first heavy ion into selected from the group consisting of Ge and Si, a top portion of said undoped polysilicon to form said a-Si layer over a remaining layer of undoped polysilicon between said gate oxide layer and said a-Si layer, and implanting arsenic solely into said a-Si layer;
   d) masking said nMOS site formed by step c), forming an a-Si layer over said pMOS site by implanting a second heavy ion selected from the group consisting of Ge and Si, into a top portion of said undoped polysilicon to form said a-Si layer over a remaining layer of undoped polysilicon between said gate oxide layer and said a-Si layer, and implanting boron solely into said a-Si regions;
   e) laser annealing said nMOS and pMOS sites for a period of time between about 40 ns and 80 ns, and at an energy level sufficient to melt at least a portion of the a-Si but insufficient to melt the polysilicon; and
   f) affecting cooling after laser annealing to convert a-Si into polysilicon without gate oxide damage.

2. The method of claim 1 wherein said first heavy ion implantation is affected by using Ge.

3. The method of claim 1 wherein said first heavy ion implantation is affected using Si.

4. The method of claim 1 wherein said second heavy ion implantation is affected using Ge.

5. The method of claim 1 wherein said second heavy ion implantation is affected using Si.

6. The method of claim 1 wherein said layer of undoped polysilicon has a thickness of between about 50 Å and about 200 Å.

7. In a method of making a dual work function gate electrode of a CMOS semiconductor structure, the improvement comprising formation of the dual work function gate electrode so that there is no boron penetration in the channel region and no boron depletion near the gate oxide, comprising:
   a) forming a gate oxide layer over a channel of a nMOS site and over a channel of a pMOS site;
   b) forming an undoped polysilicon layer over said gate oxide layer;
   c) masking said pMOS site, forming an a-Si layer over said nMOS site using a first heavy ion implantation with a material selected from the group consisting of Ge and Si, and implanting arsenic solely into said a-Si layer;
   d) masking said nMOS site formed by step c), forming an a-Si layer over said pMOS site using a second heavy ion implantation with a material selected from the group consisting of Ge and Si, and implanting boron solely into said a-Si regions;
   e) laser annealing said nMOS and pMOS sites with a pulse having a period of time of between about 40 ns and about 80 ns and at an energy level sufficient to melt at least a portion of the a-Si but insufficient to melt the polysilicon; and
   f) affecting cooling after laser annealing to convert a-Si into polysilicon without gate oxide damage.

8. The method of claim 7 wherein said laser energy level sufficient to melt at least a portion of a-Si but insufficient to melt said polysilicon is between about 0.3 J/cm$^2$ to about 0.7 J/cm$^2$.

9. The method of claim 8 wherein in step d) said boron implanting in said a-Si regions is in a concentration range from about $1 \times 10^{19}$ cm$^{-3}$ to about $5 \times 10^{20}$ cm$^{-3}$.

10. In a method of making a dual work function gate electrode of a CMOS semiconductor structure, the improvement comprising formation of the dual work function gate electrode so that there is no boron penetration in the channel region and no boron depletion near the gate oxide, comprising:
    a) forming a gate oxide layer over a channel of a nMOS site and over a channel of a pMOS site;
    b) forming an undoped polysilicon layer over said gate oxide layer;
    c) masking said pMOS site, forming an a-Si layer over said nMOS site using a first heavy ion implantation, and implanting arsenic solely into said a-Si layer;
    d) masking said nMOS site formed by step c), forming an a-Si layer over said pMOS site using a second heavy ion implantation, and implanting boron solely into said a-Si regions;
    e) laser annealing said nMOS and pMOS sites with a pulse having a period of time of between about 40 ns and about 80 ns and at an energy level sufficient to melt at least a portion of the a-Si but insufficient to melt the polysilicon; and
    f) affecting cooling after laser annealing to convert a-Si into polysilicon without gate oxide damage.

11. The method of claim 10 wherein said laser energy level sufficient to melt at least a portion of a-Si but insufficient to melt said polysilicon is between about 0.3 J/cm$^2$ to about 0.7 J/cm$^2$.

12. The method of claim 10 wherein in step d) said boron implanting in said a-Si regions is in a concentration range from about $1 \times 10^{19}$ cm$^{-3}$ to about $5 \times 10^{20}$ cm$^{-3}$.

* * * * *

UNITED STATES PATENT AND TRADEMARK OFFICE
CERTIFICATE OF CORRECTION

| | | |
|---|---|---|
| PATENT NO. | : 6,867,087 B2 | Page 1 of 1 |
| APPLICATION NO. | : 09/988183 | |
| DATED | : March 15, 2005 | |
| INVENTOR(S) | : Lee et al. | |

It is certified that error appears in the above-identified patent and that said Letters Patent is hereby corrected as shown below:

Title page, Inventor: item (75), line 2, delete "Woo-Tang Kang" and insert --Woo-Tag Kang--.

Signed and Sealed this

Thirty-first Day of July, 2007

JON W. DUDAS
*Director of the United States Patent and Trademark Office*